US006603637B1

(12) United States Patent
Segar et al.

(10) Patent No.: US 6,603,637 B1
(45) Date of Patent: Aug. 5, 2003

(54) ION BEAM TREATMENTS FOR MAGNETIC RECORDING HEADS AND MAGNETIC RECORDING MEDIA

(75) Inventors: Peter R. Segar, Burnsville, MN (US); Bal K. Gupta, Pleasanton, CA (US); Jeffery K. Berkowitz, Carver, MN (US); Sanghamitra Sahu, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/615,935

(22) Filed: Jul. 13, 2000

Related U.S. Application Data

(62) Division of application No. 09/237,530, filed on Jan. 27, 1999, now Pat. No. 6,368,425.
(60) Provisional application No. 60/072,768, filed on Jan. 27, 1998.

(51) Int. Cl.[7] ................................................ G11B 5/187
(52) U.S. Cl. .................................... 360/122; 360/236.5
(58) Field of Search ............................ 360/122, 235.4, 360/126, 125, 236.5, 236.6

(56) References Cited

U.S. PATENT DOCUMENTS

| 4,894,098 A | | 1/1990 | Otomo et al. ................ 148/122 |
| 5,023,738 A | | 6/1991 | Prenosil ........................ 360/122 |
| 5,636,092 A | * | 6/1997 | Nasu et al. ................... 360/122 |
| 5,838,522 A | * | 11/1998 | Komvopoulos et al. .... 360/122 |

FOREIGN PATENT DOCUMENTS

| EP | 0 573 772 A2 | | 12/1993 |
| JP | 361239414 | | 10/1986 |
| JP | 4-216307 A | * | 8/1992 |
| JP | 5-320864 A | * | 12/1993 |
| JP | 6-259845 A | * | 9/1994 |
| JP | 7-14336 A | * | 1/1995 |
| JP | 8-194930 A | * | 7/1996 |
| JP | 8-321100 A | * | 12/1996 |
| JP | 9-231510 A | * | 9/1997 |

OTHER PUBLICATIONS

Gupta et al., "Tribology of Ion Bombarded Silicon for Micromechanical Applications", J. Tribology, vol. 115, pp. 392–399 (1993).

Gupta et al., "Modification of Tribological Properties of Silicon by Boron Ion Implantation", Tribology Transactions, vol. 37 pp. 601–607 (1994).

Tsuar, B.Y., "Ion–Beam–Induced Interface Mixing and Thin–Film Reactions", Proceedings Of Electrochemical Society Symposium on Thin Film Interfaces & Interactions, vol. 80–2, pp 205–231 (1980).

Gupta et al., "Friction and Wear Behavior of Ion–Beam Modified Graphite Coatings", Tribology International, vol. 27, pp. 139–143 (1994).

Gupta et al., "Ion–Induced Modification of Graphite Coatings", Applied Physics Letters, vol. 61, pp. 1177–1179 (1992).

* cited by examiner

*Primary Examiner*—Jefferson Evans

(57) ABSTRACT

Techniques are disclosed for improving the tribology between an air bearing surface of a magnetic recording head and a magnetic recording medium. In addition, techniques are described for reducing resistance to wear and corrosion of the air bearing surface of the recording head as well as resistance to corrosion of the recording medium. Various ion beam techniques can be used to enhance the properties of the recording head and recording medium, and include ion implant techniques, ion mixing techniques and ion burnishing techniques.

11 Claims, 7 Drawing Sheets

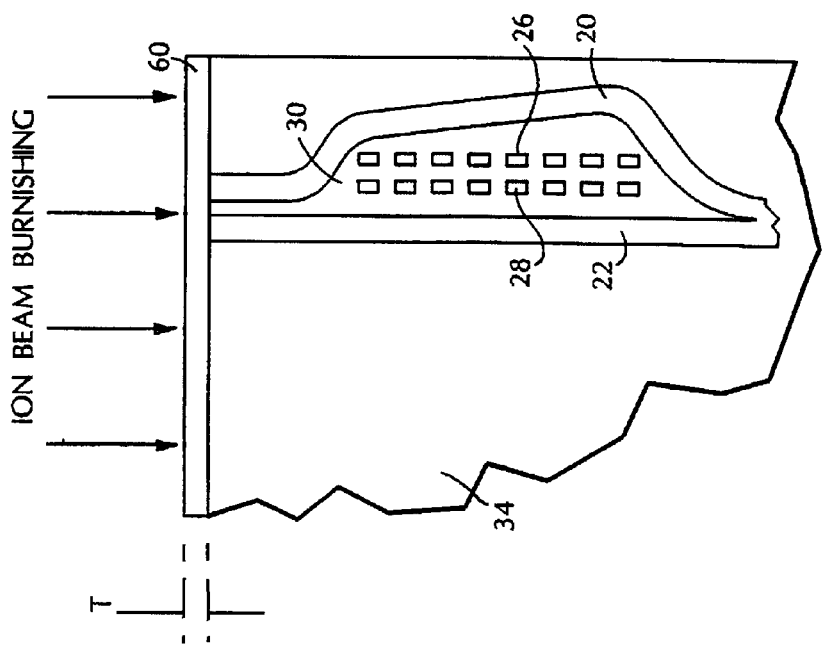
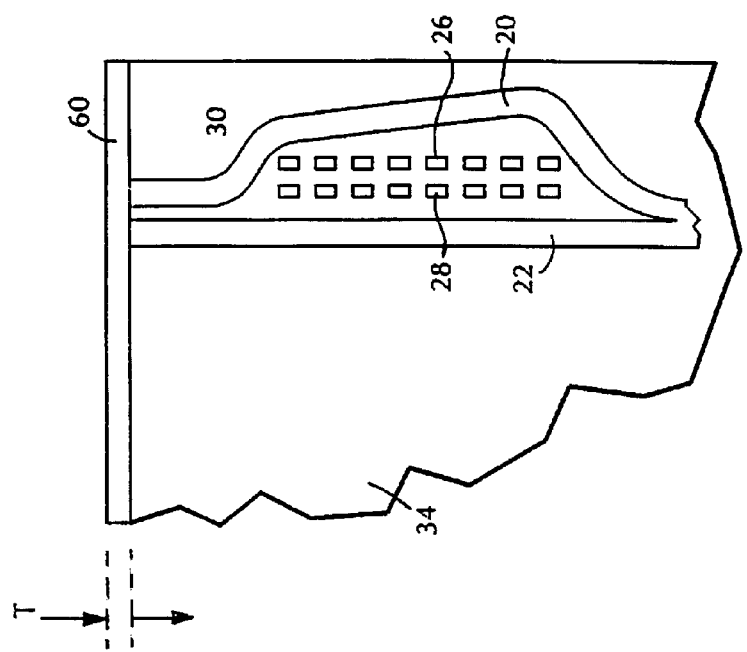

ION BEAM TREATMENTS FOR MAGNETIC RECORDING HEADS AND MAGNETIC RECORDING MEDIA

RELATED APPLICATIONS

This application is a divisional of U.S. Ser. No. 09/237,530, U.S Pat. No. 6,368,425 filed Jan. 27, 1999, which claims priority of U.S. Provisional Application Ser. No. 60/072,768, filed on Jan. 27, 1998.

BACKGROUND

The present application relates generally to magnetic recording systems and, in particular, to ion beam treatments for magnetic recording heads and magnetic recording media.

Magnetic alloys are commonly used for forming various parts of magnetic head assemblies used in computer data storage devices. For example, permalloy, a magnetic nickel-iron (NiFe) alloy, has excellent magnetic properties and can be used to form the pole tips on the air bearing surfaces of the head assembly. The air bearing surfaces are the surfaces of the magnetic recording head which contact the magnetic recording medium when the magnetic recording head is not in motion. During operation, the read/write head flies over the recording medium by compressing a fine layer of air to form a low friction gas bearing that maintains the head above, and out of contact with, the recording medium. The spacing between the air bearing surface of the magnetic recording head and the surface of the magnetic recording medium during operation is often referred to as the "fly height." In general, a small fly height is desirable to minimize distortion of signals sent to and from the magnetic head. A small fly height also can allow a higher density of magnetic transitions in the magnetic recording medium to be recorded.

Despite the good magnetic properties of permalloy and other magnetic alloys, the magnetic tip poles are subject to mechanical wear as the magnetic head is dragged over the magnetic recording medium when rotation of the magnetic recording medium is started or stopped.

Furthermore, with decreased fly heights, there should be no foreign substances on the surface of the pole tips or on the surface of the recording medium. Such foreign substances include coatings which are subject to peeling or flaking.

The magnetic surfaces of head assemblies also are subject to corrosion due to contact with moisture or other chemicals in the air. For example, vaporized water, chlorides and sulfides can corrode permalloy. Other magnetic materials, such as FeAlSi, also are subject to corrosion. Such corrosion, which can occur, for example, after manufacture of the head assembly, but prior to use, can reduce the reliability and accuracy of the head, and can lead to complete failure of the disc drive.

One technique for making the magnetic head more resistant to corrosion is disclosed in U.S. Pat. No. 5,023,738, which is assigned to the assignee of the present application. That patent discloses providing a thin anti-corrosive coating on either the entire magnetic head or portions thereof. Nevertheless, despite the recent improvements in the prevention of corrosion of the head and/or disc, further improvements are desirable to provide comparable resistance to corrosion using even thinner films. Similarly, further improvements in the tribology of the magnetic head-magnetic medium interface are desirable to enable further reductions in the fly height.

SUMMARY OF THE INVENTION

In general, techniques are disclosed for improving the tribology between an air bearing surface of a magnetic recording head and a magnetic recording medium. In addition, techniques are described for reducing resistance to wear and corrosion of the air bearing surface of the recording head as well as resistance to corrosion of the recording medium. Various ion beam techniques can be used to enhance the properties of the recording head and recording medium, and include ion implant techniques, ion mixing techniques and ion burnishing techniques.

According to one aspect, a method of fabricating a magnetic recording head includes implanting ions below an air bearing surface of the recording head.

According to another aspect, a method of fabricating a magnetic recording head includes forming a coating over a surface of the recording head, wherein the surface includes pole tips. Atoms from the coating are subsequently implanted into regions of the recording head below the coating using an ion beam mixing technique.

In yet another aspect, a method of fabricating a magnetic recording head includes providing a lubricating film over a surface of the recording head, wherein the surface includes pole tips and burnishing the film using an ion beam burnishing technique.

Using those or other techniques, a magnetic recording head can include a slider having an air bearing surface and a transducer with magnetic poles including pole tips substantially flush with the air bearing surface. The recording head has ions implanted below the air bearing surface. Similarly, a magnetic recording head can include a slider and a transducer mounted on the slider. The transducer can include magnetic poles having pole tips. A coating is provided over the pole tips to form an air bearing surface of the head. Atoms from the coating are implanted in one or more layers under the coating.

According to another aspect, a method of fabricating a magnetic recording medium includes implanting ions into a magnetic film of the recording medium.

In yet a further aspect, a method of fabricating a magnetic recording medium includes forming a coating above a magnetic film on the recording medium. Ions from the coating then are implanted into the magnetic film using an ion beam mixing technique.

According to another aspect, a method of fabricating a magnetic recording medium includes providing a lubricating film over a magnetic film in the recording medium. The lubricating film is subsequently burnished using an ion beam burnishing technique.

Using those or other techniques, a magnetic recording medium can include a substrate and a magnetic film disposed over the substrate with ions implanted into the magnetic film. Similarly, a magnetic recording medium can include a substrate, a magnetic film disposed over the substrate, and a coating disposed over the magnetic film. Atoms from the coating are implanted in the magnetic film.

Various implementations of the foregoing techniques and the magnetic recording heads and media include one or more of the following features. Ions can be implanted into pole tips of the recording head, over substantially the entire surface of the transducer, or over substantially the entire surface of the air bearing surface.

Different types of ions can be implanted, including metallic or reactive ions, as well as a mixture of ions that forms a solid lubricant. The energy of the ions in the various techniques will depend on the particular implementation. However, in some cases, energies in the range of about 2 keV to about 500 keV can be used.

When a coating is provided over the magnetic film of the recording medium or on the recording head to serve as an air bearing surface, the coating can include materials such as a metallic material or a solid lubricant, and can be relatively thin. Thus, in some implementations, the coating may have a thickness in the range of about 20 to about 100 angstroms. Atoms from the coating can then be implanted into the underlying layers using ion beam mixing.

For embodiments in which a lubricating film is provided, the lubricating film can be applied topically and bombarded with gaseous ions. The lubricating film can be applied, for example, by a dipping, painting, spraying or similar process prior to burnishing the lubricating film with ion beams.

One or more of the following advantages are present in some implementations. The various ion beam techniques can be used to improve the tribology of the interface between a recording head and a recording medium. For example, the ion beam techniques can help reduce stiction and mechanical wear of the air bearing surfaces of the recording head and/or the upper surface of the recording medium. Thus, reduced fly heights can be obtained, thereby allowing greater densities of magnetic transitions to be recorded in the magnetic recording medium. The ion beam techniques also can provide comparable resistance to corrosion of those surfaces using relatively thin protective films and, in some cases, even in the absence of a protective film. In some cases, the ion beam techniques can provide greater resistance to corrosion than using prior known techniques. In yet other instances, the ion beam treatments can improve adherence of a protective overcoat to the underlayers of either the head or the recording medium and can help reduce the porosity and the number of pinholes in such overcoats. The ion beam burnishing can, therefore, help increase the hardness of the overcoats. In some cases, the ion beam treatment may also improve the magnetic properties of the magnetic head poles or the magnetic layer in the recording medium.

Additional features and advantages of the invention will be apparent from the following detailed description, accompanying drawings and claims.

BRIEF DESCRIPTION OF THE DRAWINGS

FIGS. 8A and 8B illustrate an ion beam burnishing technique with respect to a recording head according to the invention.

DETAILED DESCRIPTION

Figure 1:
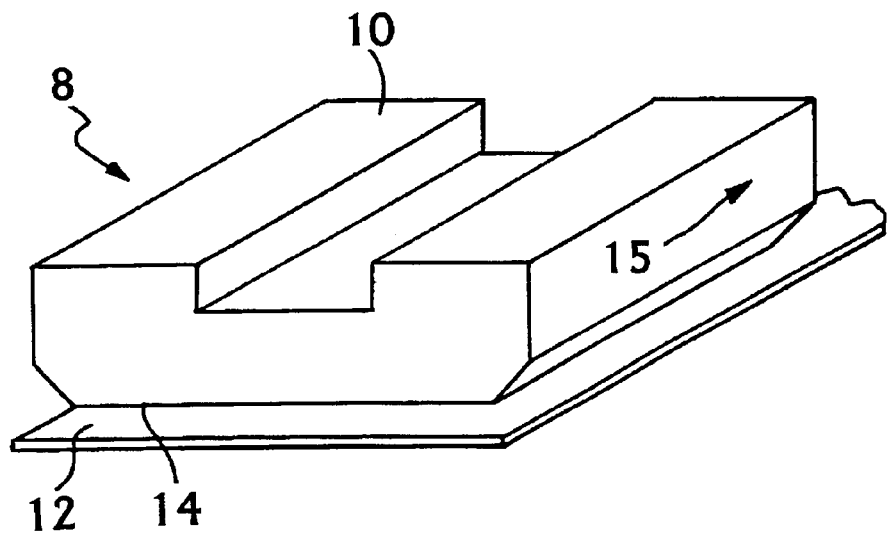
FIG. 1 illustrates a magnetic recording head and a magnetic recording medium.

Referring to FIG. 1, a magnetic recording head 8 forms part of a head arm assembly for a computer disc drive. The head 8 includes a slider 10 having air bearing surfaces 14. The head 8 transmits and receives information to and from a magnetic recording medium or disc 12 which moves relative to the air bearing surfaces 14 in the direction of the arrow 15.

Figure 2:
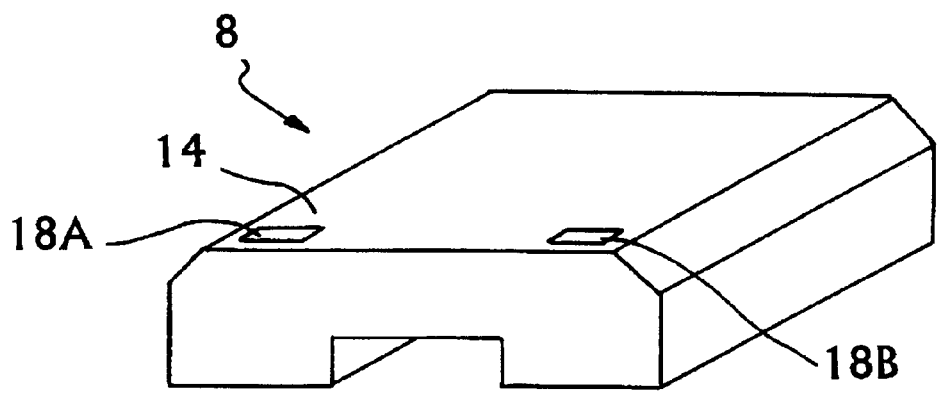
FIG. 2 shows another view of the magnetic recording head of FIG. 1.
Figure 3:
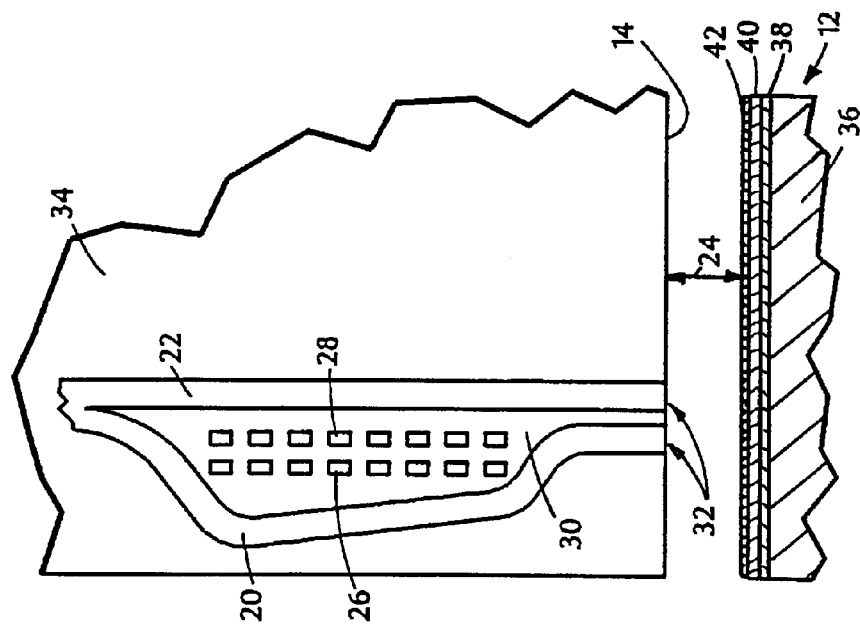
FIG. 3 illustrates a cross-sectional view of a magnetic head and magnetic recording medium.

As shown in FIG. 2, transducers 18A, 18B are mounted near the trailing end 16 of the head 8 and are flush with the air bearing surfaces 14. Referring to FIG. 3, each transducer 18A, 18B includes an upper pole 20 and a lower pole 22, each of which has a respective pole tip 32 near the air bearing surface 14. The poles 20, 22 form a thin film core and can comprise a nickel-iron (NiFe) alloy, such as permalloy, or an aluminum-iron alloy such as FeAlSi. Photo-lithography can be used to define the geometry of the poles 20, 22. Conductive coils 26, 28 extend between the poles 20, 22 and are electrically insulated from the poles by an insulating layer 30. The transducers 18A, 18B are formed on a non-magnetic substrate 34 which can comprise a ceramic composite compound such as $Al_2O_3$—TiC.

Several pattern transfer processes can be used to deposit layers on the substrate 34 to form the poles 20, 22, the insulating layer 30 and the coils 26, 28. The transfer processes can include chemical etching, plating and sputtering, among others. The fabrication process for the head 8 can include multiple masking levels and numerous processing steps.

During fabrication, many thin film magnetic heads are deposited across the surface of a wafer or substrate. After the layers are deposited, the wafer is diced or sliced into many individual thin film heads, each carried by a portion of the wafer so that the pole tips 32 are exposed. The pole tips 32 and the portion of the substrate 34 that underlies them can be lapped in a direction generally inward, toward the center of the thin film head to achieve the desired dimensions. The lapping process is a grinding process in which the exposed portions of the pole tips 32 are applied to an abrasive, such as a diamond slurry. Electrical contacts (not shown) are connected to the conductive coils 26, 28.

Still referring to FIG. 3, in general, the thin-film medium or disc 12 includes a rigid disc substrate 36 and various thin-film layers successively formed over the substrate. The layers generally include a crystalline underlayer 38 and a magnetic thin-film layer 40, and may also include a protective overcoat 42.

The substrate 36 can be, for example, a textured substrate such as a conventional surface-coated, textured aluminum substrate, or a textured glass or ceramic substrate.

The crystalline underlayer 38 can include, for example, a sputtered chromium (Cr) underlayer having a thickness in the range of about 300 to 3,000 angstroms (Å). Alternatively, the underlayer 38 can be formed of a chromium-based alloy, such as CrGd, CrV, CrTi or CrSi.

The magnetic film layer 40 can be, for example, a cobalt-based alloy, in other words, an alloy containing at least 50% cobalt, which is formed on the underlayer 38 by sputtering or other known techniques. Exemplary thin-film alloys include binary and ternary alloys such as Co/Cr, Co/Ni, Co/Cr/Ta, Co/Ni/Pt and Co/Cr/Ni, and quaternary and five-element alloys such as Co/Ni/Cr/Pt, Co/Cr/Ta/Pt, Co/Cr/Ta/Pt/B and Co/Cr/Ni/Pt/B.

A wear-resistant, protective carbon overcoat 42 can be sputtered over the magnetic recording layer 40. Exemplary materials for the overcoat layer 42 include amorphous carbon (α-C:H), amorphous carbon-nitride (α-C:N) and α-C:H:N. Other materials also can be used as the protective overcoat 42. In some implementations, the carbon overcoat 42 has a thickness of approximately 20–100 Å.

In operation, in other words, when the head 8 and the magnetic recording medium 12 are moving relative to each other, the pole tips 32 are positioned near the moving magnetic medium 12, and an air gap 24 is formed (FIG. 3). The height of the air gap 24, or the fly height, is established by a self acting hydrodynamic air bearing between the head 8 and the recording medium 12.

During a read operation, the changing magnetic flux of the moving medium 12 impresses a changing magnetic flux on the pole tips 32. The magnetic flux is carried through the pole tips 32 and core around the conductive coils 26, 28. The changing magnetic flux induces an electrical voltage across the conductor coils 26, 28 which can be detected with electrical detection circuitry (not shown) The electrical voltage is representative of the changing magnetic flux produced by the moving magnetic medium 12.

During a write operation, an electrical current is caused to flow in the conductive coils 26, 28. The electrical current induces a magnetic field in the poles 20, 22 and causes a magnetic field across the gap between the pole tips 32. A fringe field extends in the vicinity beyond the boundary of the pole tips 32 and into the nearby magnetic medium 12. The fringe field can be used to impress magnetic fields on the storage medium 12 and write information magnetically.

Figure 4:
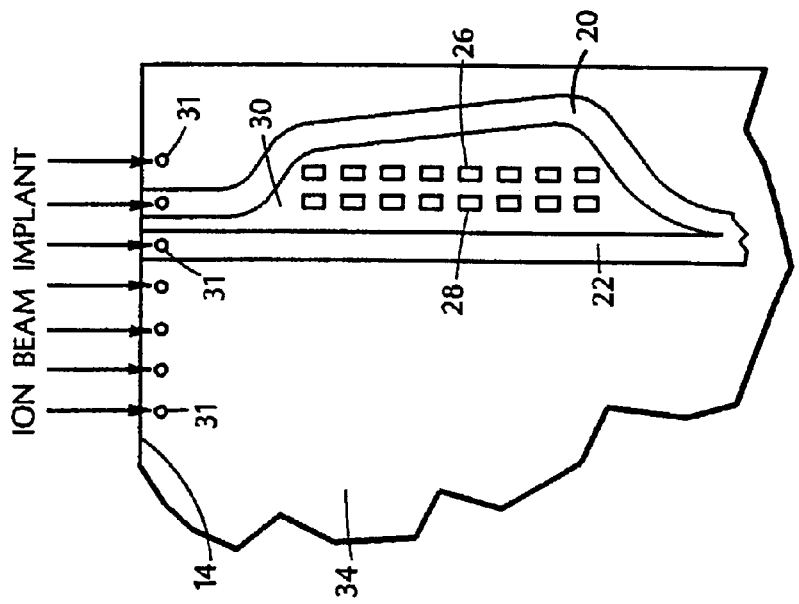
FIG. 4 illustrates an ion beam implant technique with respect to a recording head according to the invention.

To improve the tribology at the interface between the recording medium 12 and the head 8, according to one embodiment, ions 31 are implanted just below the air bearing surface(s) 14 of the head (FIG. 4). The ions, which can be implanted, for example, using an ion gun in an ultra-high vacuum chamber, can be implanted into the pole tips, over the entire surface of the transducers 18A, 18B, or over the entire air bearing surfaces 14.

In one implementation, reactive ions such as carbon (C), nitrogen (N) or boron (B) are implanted into the surface of the pole tips 32 to form carbides, nitrides or borides, respectively, of the magnetic material which forms the poles 20, 22. Thus, for example, if permalloy is used for the poles 20, 22, implanting B ions would result in the formation of a nickel-iron-boride layer at or near the pole tips 32. Implanting such reactive ions can help improve various properties of the pole tips 32 and the air bearing surfaces 14 of the substrate 34, including their hardness, their elastic and plastic behavior, and their resistance to corrosion.

According to another implementation, metallic ions such as chromium (Cr), gold (Au), silicon (Si), platinum (Pt) or palladium (Pd) are implanted into the head 8 near the air bearing surface(s) 14. Implanting such metallic ions can increase the resistance of the air bearing surface(s) 14 to corrosion and, in some cases, may help improve the magnetic properties of the pole tips 32.

In yet another' implementation, a mixture of molybdenum (Mo) and sulfur (S) ions are implanted into air bearing surface(s) 14. Preferably, the Mo and S ions are implanted in a ratio of approximately 1-to-2 to form a solid lubricant of molybdenum disulfide ($MoS_2$). In general, the implantation of ions over all or part of the air bearing surfaces 14 of the magnetic head 8 can help reduce stiction and mechanical wear of the air bearing surfaces and can provide greater resistance to corrosion.

The energy at which the ions are implanted over the air bearing surface(s) 14 of the head 8 depend on the desired depth of implantation which, in general, should extend only a small distance into the magnetic material. Exemplary implant depths are in the range of about 20 to 5,000 Å, and exemplary ion energies are in the range of about 2 to 500 keV. In some cases, it may be desirable to provide a range of ion energies so that the ions are implanted over a range of depths. The ions can be directed into the head 8 at angles that either are substantially perpendicular to the air bearing surfaces 14 or that are substantially less than ninety degrees with respect to the air bearing surfaces. To reduce residual stresses that may result from the ion implant, an anneal process subsequently can be performed.

In the implementation discussed above, the ion implant is performed after the wafer is diced or sliced into individual thin film heads. However, the ion beam treatment also can be performed during wafer processing prior to slicing the wafer into individual thin film heads.

Figure 5:
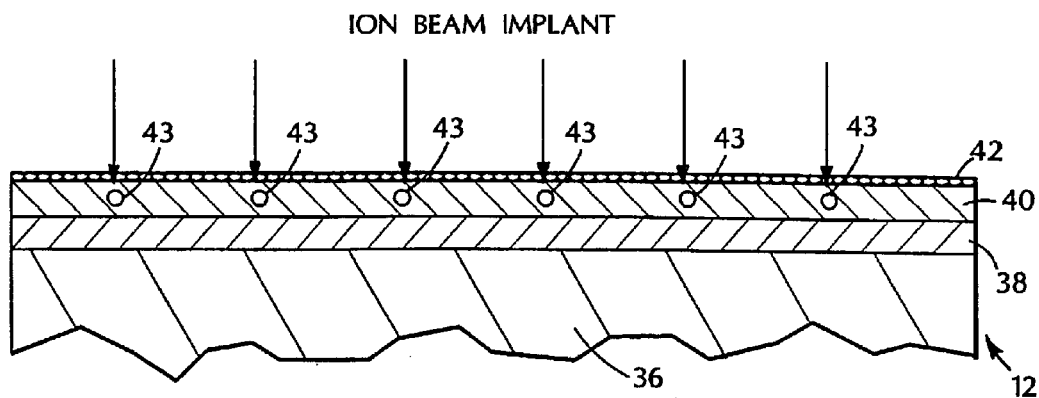
FIG. 5 illustrates an ion beam implant technique with respect to a recording medium according to the invention.

According to another embodiment, an ion beam implant as described above can be performed with respect to the upper surface of the recording medium 12 to improve the tribology at the interface between the recording medium and the head 8. In particular, ions 43 are implanted into the magnetic film 40 near the interface of the magnetic film and the protective overcoat 42 (FIG. 5). As described above with respect to the magnetic head 8, various types of ions can be implanted through the upper surface of the recording medium 12. Thus, reactive ions, such as C, N or B, or metallic ions, such as Cr, Au, Si, Pt or Pd, can be implanted through the upper surface of the recording medium 12. Alternatively, a mixture of Mo and S ions can be implanted into the region at the interface between the protective overcoat 42 and the magnetic film 40 to form $MoS_2$. For some implementations, the ion implant energies and implant depths can be on the same order as those discussed above with respect to the ion beam treatment for the magnetic head 8. However, the depth of the ion implant should not extend too far into the magnetic film 40 so as to interfere with the magnetic properties of the film. As discussed above, an anneal process can be carried out to reduce residual stresses that may result from the ion implant.

During operation of the head 8 and magnetic recording medium 12, the protective overcoat 42 on the recording medium will tend to wear. However, the ions implanted into the magnetic film 40 near the interface with the protective overcoat 42 can help improve the properties of the medium 12. For example, the hardness of the material near the carbon overcoat-magnetic film interface can be enhanced, and the mechanical wear and stiction can be reduced. Furthermore, the interface can be more resistant to corrosion and, in some cases, can exhibit improved magnetic properties.

Figure 6B:
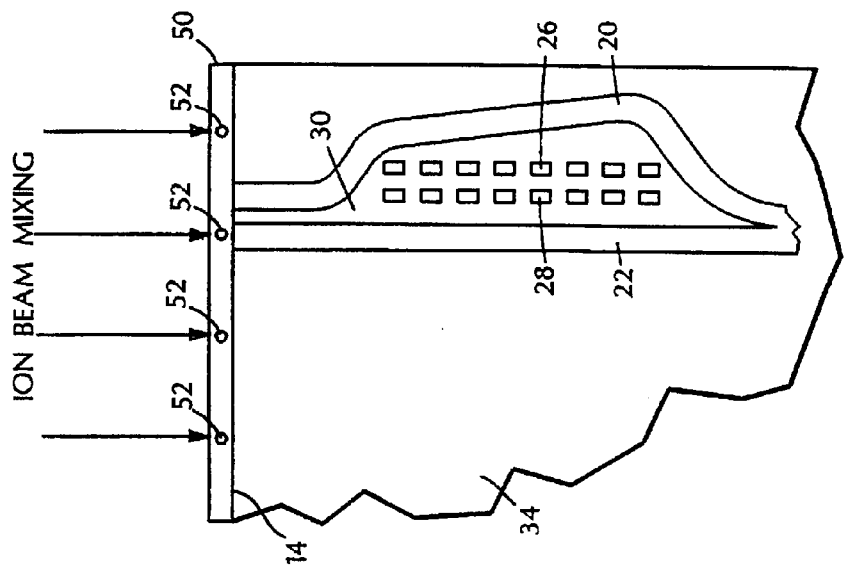
FIGS. 6A through 6C illustrate an ion beam mixing technique with respect to a recording head according to the invention.
Figure 6A:
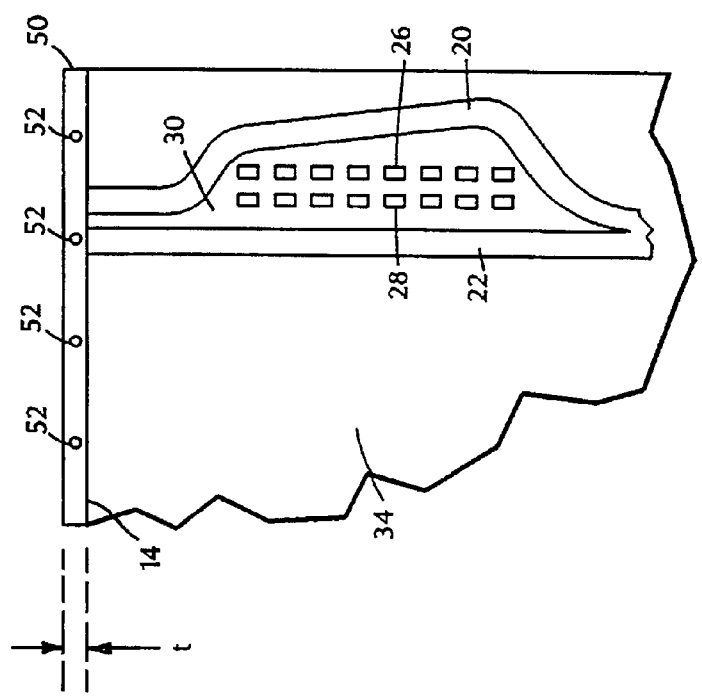
Figure 6C:
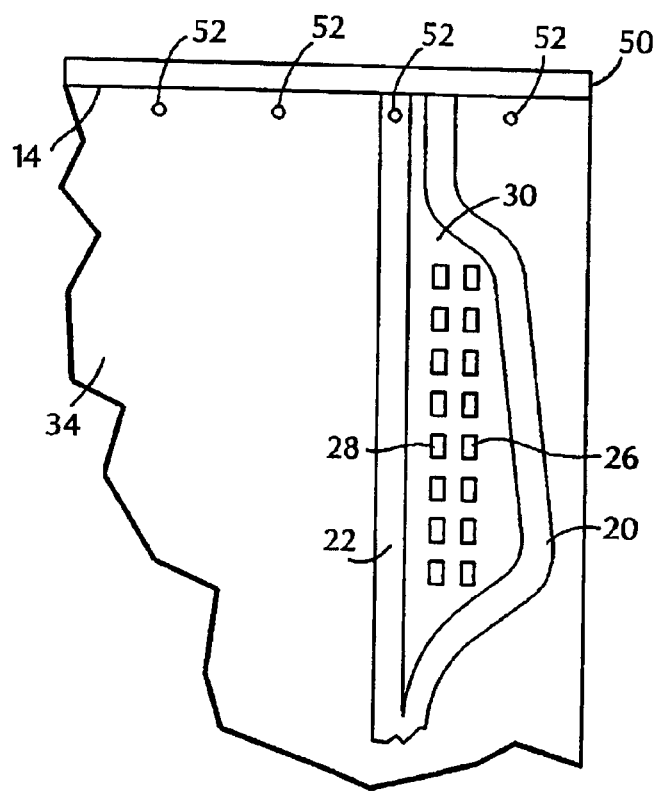

In alternative embodiments, instead of using an ion beam implant to improve the tribology of the air bearing surface(s) of the head 8 and/or the upper surfaces of the magnetic recording medium 12, an ion beam mixing technique is used to implant the ions. According to the ion beam mixing technique, a thin film coating 50 is deposited, for example, on the exposed surface(s) of the head 8 including the pole tips 32 (FIG. 6A). The coating 50 can comprise, for example, Au, Pt, silver (Ag), cobalt (Co), or a solid lubricant such as $MoS_2$ or the like, and can be deposited using known techniques such as sputtering. In some implementations, the coating 50 has a thickness (t) on the order of about 20 to 100 Å. Next, a beam of gas ions, such as argon (Ar) ions, is directed at the coating 50 (FIG. 6B) to knock some of the atoms 52 from the coating into the underlying layers (FIG, 6C). Other sources of gaseous ions, such as oxygen, nitrogen or krypton ions, also can be used. Suitable ion energies are on the order of about 2 to 500 keV. More generally, the ion energies should be selected so that some of the atoms from the coating 50 are implanted into regions of the substrate 34 near the interface with the coating. Some of the atoms 52 from the coating 50 also may be implanted into regions of the poles 20, 22 near the pole tips 32. The implanted atoms 52 can help reduce the stiction and wear due to their solid lubricant behavior.

Figure 7A:
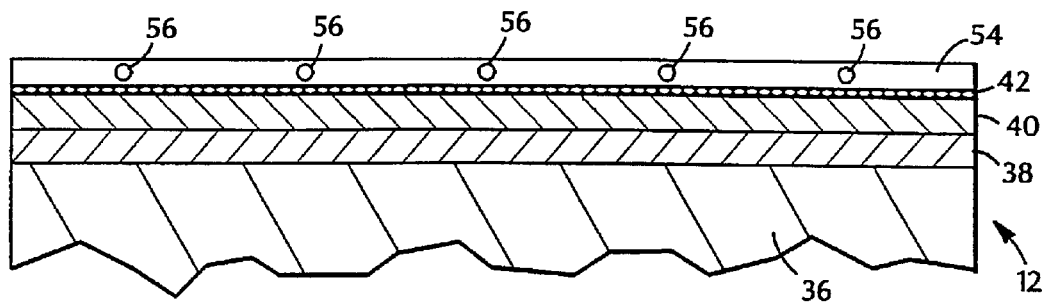
FIGS. 7A through 7C illustrate an ion beam mixing technique with respect to a recording medium according to the invention.
Figure 7B:
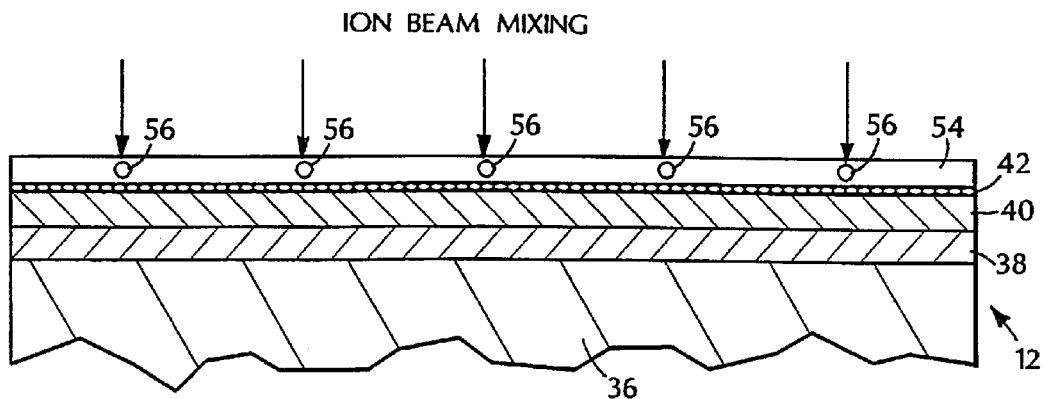
Figure 7C:
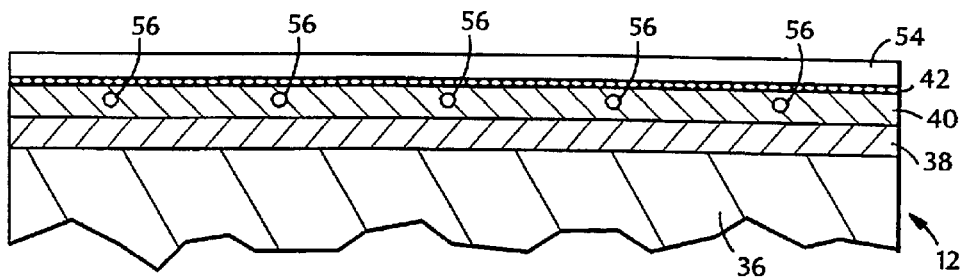

The ion beam mixing techniques also can be used to reduce the stiction and wear of the upper surface of the magnetic recording medium 12. Thus, a thin film coating 54, which is deposited over the surface of the protective carbon overcoat 42 (FIG. 7A) or directly on the magnetic film 40, is bombarded with gas ions (FIG. 7B) so as to implant some of the atoms 56 from the coating 54 into the magnetic film (FIG. 7C). Suitable materials for the coating 54 are those identified above with respect to ion beam mixing for the head 8. As before, the thickness of the coating 54 can be, for example, in the range of about 20 to 100 Å. The ion energies should be selected so that the atoms 56 from the coating 54 are primarily implanted into regions of the magnetic film 40 near the interface with the protective carbon coating 42 (or near the interface with the thin film coating if the protective carbon coating is not provided).

Advantages of the ion beam mixing techniques include the ease with which atoms of materials that are difficult or expensive to produce in the form of ion beams can be implanted into the recording medium 12 or heads 8. Also, desired concentrations of implanted ions can be obtained using relatively low doses of easily available gaseous ions. Additionally, the relatively high density and high compressive residual stresses of the bombarded coating 50 (or 54) can result in a coating with a relatively high hardness.

In yet another embodiment, an ion beam burnished coating technique is used to improve the tribology of the air bearing surface(s) of the head 8 and/or the upper surface of the magnetic recording medium 12. A topically-applied lubricating film 60 is provided, for example, on the surface(s) of the head 8 including the pole tips 32 (FIG. 8A). The film 60 can comprise $MoS_2$, graphite or the like, and can be provided by using a colloidal suspension of $MoS_2$ or graphite in isopropanol containing a thermoplastic. The film 60 can be applied by dipping, painting, spraying or similar processes to a thickness (T) on the order of about 20 to 1,000 Å. Once the film 60 is applied, it is burnished by subjecting it to an ion beam treatment (FIG. 8B). Gaseous ions such as argon ions, nitrogen ions or hydrogen ions can be used to bombard the film 60 at a dose, for example, of about $10^{14}$ to $10^{16}$ ions-$cm^2$. Exemplary ion energies are in the range of about 2 to 500 keV. The ion beam burnishing process causes the topically-applied film 60 to adhere to the underlayers and can reduce the porosity and the number of pinholes in the film. The ion beam burnishing can, therefore, improve the hardness of the air bearing surface(s) of the head 8, enhance its resistance to wear, and provide improved protection from corrosion.

Figure 9:
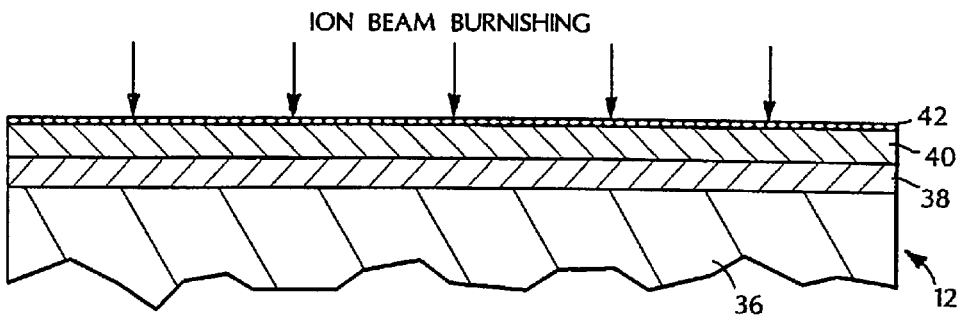
FIG. 9 illustrates an ion beam burnishing technique with respect to a recording medium according to the invention.

The ion beam burnished coating technique also can be used to improve the tribology of the upper surface of the magnetic recording medium 12. In one implementation, the protective carbon coating 42 is burnished with an ion beam treatment (FIG. 9) in a manner similar to the one discussed above with respect to FIG. 8B. The ion beam burnishing treatment can improve adhesion of the protective coating 42 and improve its resistance to wear.

Figure 10A:
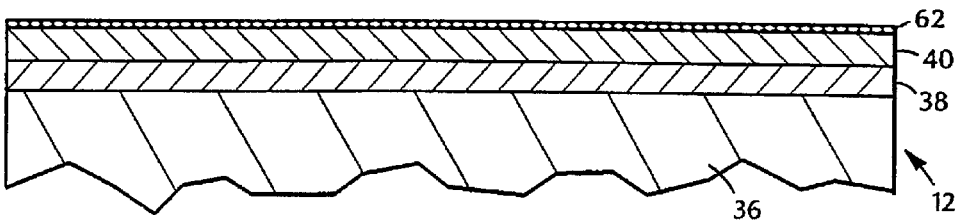
FIGS. 10A and 10B illustrate an ion beam burnishing technique with respect to a recording medium according to another embodiment of the invention.
Figure 10B:
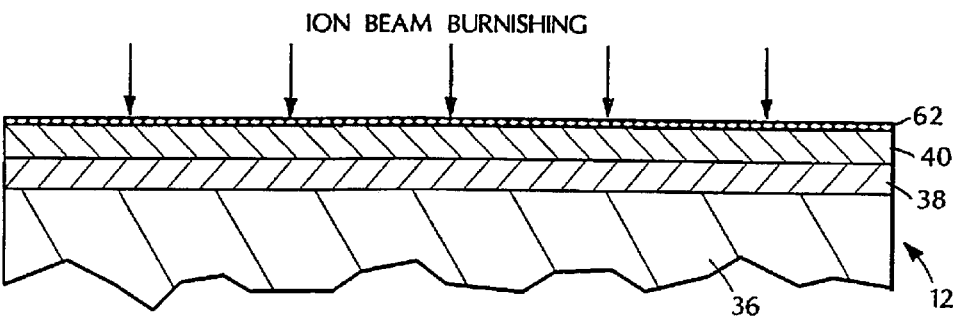

Alternatively, in place of the sputtered protective coating 42, a topically-applied lubricating film 62 can be applied directly on the magnetic layer 40 of the recording medium 12 (FIG. 10A) using, for example, a colloidal suspension of graphite or $MoS_2$. After applying the film 62 by a dipping, painting, spraying or similar process, the topically-applied film is burnished with an ion beam treatment (FIG. 10B) in a manner similar to the one discussed above with respect to FIG. 8B. The ion beam burnishing process can reduce the porosity and the number of pinholes in the protective overcoat 42 or the topically-applied film 60. The ion beam burnishing can, therefore, improve the hardness upper surface of the recording medium 12, enhance its resistance to wear, and provide improved protection from corrosion. If the topically-applied film 62 on the recording medium 12 is made sufficiently thin, then the spacing between the head 8 and the recording medium can be reduced as well, thereby allowing greater areal densities of information to be recorded on the medium.

Other implementations are within the scope of the claims.

What is claimed is:

1. A magnetic recording head comprising:
   a slider having a substrate, the substrate having a trailing end and an air bearing surface;
   a transducer formed on said trailing end of the substrate, the transducer having one or more magnetic poles comprising a magnetic alloy extending along said trailing end including one or more pole tips substantially flush with the substrate's air bearing surface; and
   said one or more magnetic poles each having a pole tip region just below the air bearing surface further including molecules selected from a group consisting of carbides, nitrides or borides.

2. A magnetic recording head according to claim 1 wherein said molecules are formed by implanting ions selected from the group consisting of carbon, nitrogen or boron at sufficient energies to form carbides, nitrides or borides with the magnetic alloy of the magnetic poles.

3. The magnetic head according to claim 2 wherein said pole tip region comprises a depth of 20 to 5000 angstroms.

4. The magnetic head according to claim 2 wherein said sufficient energies comprise 2 to 500 keV.

5. A process for making a magnetic recording head according to claim 1 comprising:
   directing reactive ions selected from a group consisting of carbon, nitrogen or boron at the air bearing surface of a slider substrate after a magnetic transducer has been formed on the training end of the substrate with the transducer's magnetic pole tips flush with the substrate's air bearing surface.

6. The process according to claim 5 wherein said reactive ions are directed at the air bearing surface at energies ranging between 2 and 500 keV.

7. The process according to claim 5 wherein said reactive ions are directed at the air bearing surface at angles between 90 degrees and angles that are substantially less than 90 degrees.

8. The process according to claim 5 further including annealing the head after ion implantation in order to remove residual stresses.

9. The magnetic head according to claim 1 wherein the magnetic poles comprise an alloy of nickel and iron, and the boride is nickel-iron-boride.

10. The magnetic head according to claim 1 wherein said pole tip region comprises a depth of 20 to 5000 angstroms.

11. A magnetic recording head comprising:
    a slider having an air bearing surface; and implanted ion means for improving the tribology between the air bearing surface and a magnetic recording medium.

* * * * *